United States Patent [19]

Stygar et al.

[11] Patent Number: 5,963,121

[45] Date of Patent: Oct. 5, 1999

[54] RESETTABLE FUSE

[75] Inventors: Vernon E. Stygar, San Diego; Jesus E. Osuna, National City, both of Calif.; Brian T. Pointer, Brightlingsea, United Kingdom; John J. Ekis, Fallbrook, Calif.

[73] Assignee: Ferro Corporation, Cleveland, Ohio

[21] Appl. No.: 09/190,032

[22] Filed: Nov. 11, 1998

[51] Int. Cl.[6] .............................. H01H 71/20; H01B 1/06; H01B 1/20; H01B 1/22

[52] U.S. Cl. .......................... 337/155; 337/167; 337/180; 337/251; 337/14; 252/511; 252/512; 338/22 R

[58] Field of Search ................................... 337/155, 297, 337/290, 295, 167, 180, 181, 26, 31, 251, 14; 338/204, 205, 22 R, 23; 252/511, 512

[56] References Cited

U.S. PATENT DOCUMENTS

| | | | |
|---|---|---|---|
| 4,545,926 | 10/1985 | Fouts, Jr. et al. | 252/511 |
| 4,629,584 | 12/1986 | Yasuda | 252/511 |
| 4,845,838 | 7/1989 | Jacobs et al. | 29/671 |
| 4,924,074 | 5/1990 | Fang et al. | 219/548 |
| 4,935,156 | 6/1990 | Van Konynenburg et al. | 219/553 |
| 4,954,696 | 9/1990 | Ishii et al. | 219/548 |
| 4,955,267 | 9/1990 | Jacobs et al. | 29/611 |
| 4,967,176 | 10/1990 | Horsma et al. | 338/22 R |
| 5,039,844 | 8/1991 | Nagahori | 219/541 |
| 5,093,036 | 3/1992 | Shafe et al. | 252/511 |
| 5,106,538 | 4/1992 | Barma et al. | 252/511 |
| 5,122,641 | 6/1992 | DeChurch | 219/548 |
| 5,140,297 | 8/1992 | Jacobs et al. | 338/22 R |
| 5,195,013 | 3/1993 | Jacobs et al. | 361/106 |
| 5,227,946 | 7/1993 | Jacobs et | 361/106 |
| 5,268,424 | 12/1993 | Lawson | 525/67 |
| 5,280,263 | 1/1994 | Sugaya | 338/22 R |
| 5,344,591 | 9/1994 | Smuckler | 252/511 |
| 5,374,379 | 12/1994 | Tsubokawa et al. | 252/511 |
| 5,382,938 | 1/1995 | Hansson et al. | 338/22 R |
| 5,451,921 | 9/1995 | Crawford et al. | 338/220 |
| 5,614,881 | 3/1997 | Duggal et al. | 338/22 R |
| 5,663,702 | 9/1997 | Shaw, Jr. et al. | 337/183 |
| 5,677,662 | 10/1997 | Bresolin et al. | 338/22 R |
| 5,691,689 | 11/1997 | Smith et al. | 338/22 R |
| 5,714,096 | 2/1998 | Dorfman | 252/511 |
| 5,742,223 | 4/1998 | Simendiner, III et al. | 338/21 |

*Primary Examiner*—Leo P. Picard
*Assistant Examiner*—Anatoly Vortman
*Attorney, Agent, or Firm*—Rankin, Hill, Porter & Clark LLP

[57] ABSTRACT

The present invention relates to compositions for use in forming resettable electronic circuit protection devices or fuses, methods of forming resettable fuses using the compositions, and resettable fuses formed from the compositions. Resettable fuse compositions according to the present invention include a mixture of the reaction product of polyethylene glycol and a diepoxide having a molecular weight of at least 18,000, solvent, conductive particles, and optional solvent volatility adjusters. In a preferred embodiment, resettable fuses according to the present invention are formed by screen printing the compositions directly onto printed electric circuits to form fuses. During current overload conditions, the temperature of the resettable fuse material rapidly increases due to resistive heating generated by excessive current flow through the conductive particle chains or pathways. In such current overload conditions, resettable fuses according to the present invention rapidly convert from a low resistance solid state to a high resistance liquidus state wherein the chains of conductive particles become highly separated thus causing the flow of electric current through the fuse to become completely cut off. After the overload condition has been cleared, resettable fuses according to the present invention self cool, re-solidify, and return to their prior low resistance solid state without exhibiting any change in resistance or switching temperature due to changes in the degree of crystallinity of the heat cured reaction product.

20 Claims, 1 Drawing Sheet

RESETTABLE FUSE

FIELD OF INVENTION

The present invention relates to compositions for use in forming resettable electronic circuit protection devices or fuses, methods of forming resettable fuses using the compositions, and resettable fuses formed from the compositions.

BACKGROUND

Electronic devices sometimes experience overload conditions due to faults or shorts in one or more circuits. If an overload condition is not effectively eliminated very quickly, it can cause intense localized resistive heating to occur in one or more circuits which can damage or destroy the electronic device. To protect electronic devices from the dangers of overload conditions, standard fuses, which generally comprise a thin strip or ribbon of metal, have been used for many years. When an overload condition occurs in a circuit protected by a standard fuse, resistive heating generated by the excessive current flow through the thin strip or ribbon of metal causes it to melt and disjoin thereby breaking the circuit and protecting the device. In essence, the integrity of the standard fuse is sacrificed in order to protect the integrity of the electronic device.

Although standard fuses are highly effective in protecting electronic circuits, they are not practical for many applications, particularly miniaturized modern electronic devices. A standard fuse is a one time use device that must be replaced after an overload condition has been cleared because the thin strip or ribbon of metal cannot be rejoined after it has melted through. In some applications, the expense incurred to locate and replace a standard fuse can exceed the value of the electronic device that it was intended to protect.

It was discovered many years ago that materials exhibiting a positive temperature coefficient of resistance (PTC) could be utilized to form electronic circuit protection devices that overcome the one-time-use limitation of standard fuses. PTC circuit protection devices are generally formed from materials comprised of conductive particles dispersed in an organic polymer matrix. At normal current flows and temperatures, the conductive particles form chains or paths in the polymer matrix to create a polymer composite with high electrical conductivity. However, when the material is exposed to excessive current flows, resistive heating generated by the excessive current flow through the conductive particle chains causes the polymer to self-heat above its glass transition temperature ($T_g$). The increase in temperature beyond the glass transition temperature of the polymer causes the polymer to expand and thereby separate some of the chains of conductive particles dispersed therein. This results in an increase in the electrical resistance of the material and substantially reduces the amount of current which flows through the PTC device into the protected circuit. Once the overload condition is cleared, the polymer self-cools and contracts where the conductive particles again form conductive paths to resume low resistance electrical current conduction.

Although known PTC devices effectively overcome the one-time-use limitation of standard fuses, they present new problems. The switching effect of most PTC devices is based upon the glass transition temperature of the conductive particle filled polymer. Thus, the switching effect is dependent in large part upon the degree of crystallinity of the polymer, which is generally a function of its heat history. A polymer that has been subjected to heating above its glass transition temperature will generally exhibit a higher degree of crystallinity upon cooling as compared to a similar polymer which has not been exposed to such heating. Thus, one of the problems with prior art PTC circuit protection devices is that each time the material goes through a heat cycle as a result of a current overload condition, the degree of crystallinity of the polymer is incrementally increased when it returns to its low resistance state thus resulting in a change in the switching temperature of the device for the next switching cycle and sometimes the initial resistance.

Another limitation of PTC circuit protection devices is that the material does not completely break the flow of current to the device or circuit being protected. At or above the switching temperature, the increased resistance of the PTC material substantially lowers the current flowing through the device, but some electrical current continues to pass through or leak into the electronic device or circuit being protected. Thus, the switching effect of known PTC devices is only a few decades (i.e., a few times $10^x$ ohms). In certain applications, the continued flow of electrical current into the device during an overload condition can be detrimental to the integrity of the device.

Yet another limitation of PTC circuit protection devices arises from the manner in which they must be installed in electronic devices by manufacturers. The customary method of constructing a PTC device generally comprises extruding a polymer having an electrically conductive material dispersed therein into a film or sheet. Metallic electrode plates, usually metal foils or screens, are then applied to opposite sides or ends of the extruded conductive particle filled polymer film and bonded to the extruded polymer by heat and pressure. The metal plated polymer film is then cut into strips and the metal foil electrode plates are welded or soldered into a metal case. PTC devices of this type are then shipped to manufacturers who mount them in electronic devices using soldering techniques. This introduces space limitations in circuit design. Moreover, soldering or welding of this nature must be very precise in order to properly position the PTC device in the circuit without damaging it or the circuit in the electronic device. Another inherent problem with soldering or welding prior art PTC devices into electronic devices is that it causes the whole of the PTC device to be heated during installation. This can cause a portion of the PTC polymer to pyrolyze resulting in the evolution of gas which can weaken the bond between the conductive particle filled polymer composition and metal foil electrode plates. This weakening of the bond between the electrode plates and the polymer, coupled with the additional heating of the polymer itself, which can result in an increase in the crystallinity of the polymer, can increase the resistance of the PTC device beyond that which it was originally intended to provide.

A circuit protection device or fuse is needed which can overcome the limitations of standard fuses and the limitations of electrical circuit protection devices formed from known PTC materials. Ideally, such a circuit protection device would be formed from a composition that could be screen-printed directly onto a printed circuit in a variety of shapes or patterns to form resettable fuses that do not exhibit changes or variations in their predetermined switching temperatures over time.

SUMMARY OF THE INVENTION

The present invention provides new compositions which are useful for forming electronic circuit protection devices or fuses, methods of forming resettable fuses using such compositions, and resettable fuses formed from such compositions. Resettable fuse compositions according to the present invention are comprised of a mixture of the reaction product of polyethylene glycol and a diepoxide having an average molecular weight of at least 18,000 (hereinafter sometimes referred to herein as "the reaction product"), solvent, conductive particles, and optional solvent volatility adjusters. The reaction product preferably has an average molecular weight of at least 20,000. The solvent is preferably water. The conductive particles are preferably silver flake. And, the optional solvent volatility adjusters are preferably alcohols, ketones or aldehydes.

The methods of forming resettable fuses according to the present invention comprise providing an electronic circuit having at least one fuse terminal formed from silver-filled epoxy resin on a substrate, providing a resettable fuse composition comprised of a mixture of the reaction product of polyethylene glycol and a diepoxide having an average molecular weight of at least 18,000, solvent, conductive particles, and optional solvent volatility adjusters, applying the resettable fuse composition to the electronic circuit, and heating the substrate having the electronic circuit and resettable fuse composition disposed thereon to flash off the solvent and cure the resettable fuse composition. In a preferred embodiment, the composition is applied to the electronic circuit disposed on the substrate by screen printing.

Resettable fuses according to the present invention comprise a mixture of the reaction product of polyethylene glycol and a diepoxide having an average molecular weight of at least 18,000, solvent, conductive particles, and optional solvent volatility adjusters which has been applied to the fuse terminals of an electric circuit disposed on a substrate, at least one of said fuse terminals being formed from a silver, filed epoxy resin, and heated to form a resettable fuse section. During overload conditions, the temperature of the fuse section rapidly increases due to resistive heating generated by excessive current flow through the conductive particle chains. Resettable fuses according to the present invention rapidly convert from a low resistance solid state to a high resistance liquidus state wherein the chains of conductive particles become separated thus causing the flow of electric current through the resettable fuse to become completely cut off. After the overload condition has been cleared, resettable fuses according to the present invention self cool, re-solidify, and return to their prior low resistance solid phase state. By varying the molecular weight of the reaction product, resettable fuses exhibiting a wide range of melt temperatures can be produced. The initial resistance of resettable fuses according to the present invention at room temperature can be selectively varied in the range from a few milliohms to several ohms in value based upon the geometry of the resettable fuse, the degree of conductive particle loading, and the molecular weight of the reaction product. It should be noted that resettable fuses according to the present invention do not exhibit variations in their switching effect as a result of repeated heat cycles.

The foregoing and other features of the invention are hereinafter more fully described and particularly pointed out in the claims, the following description setting forth in detail certain illustrative embodiments of the invention, these being indicative, however, of but a few of the various ways in which the principles of the present invention may be employed.

DETAILED DESCRIPTION

Figure 1:
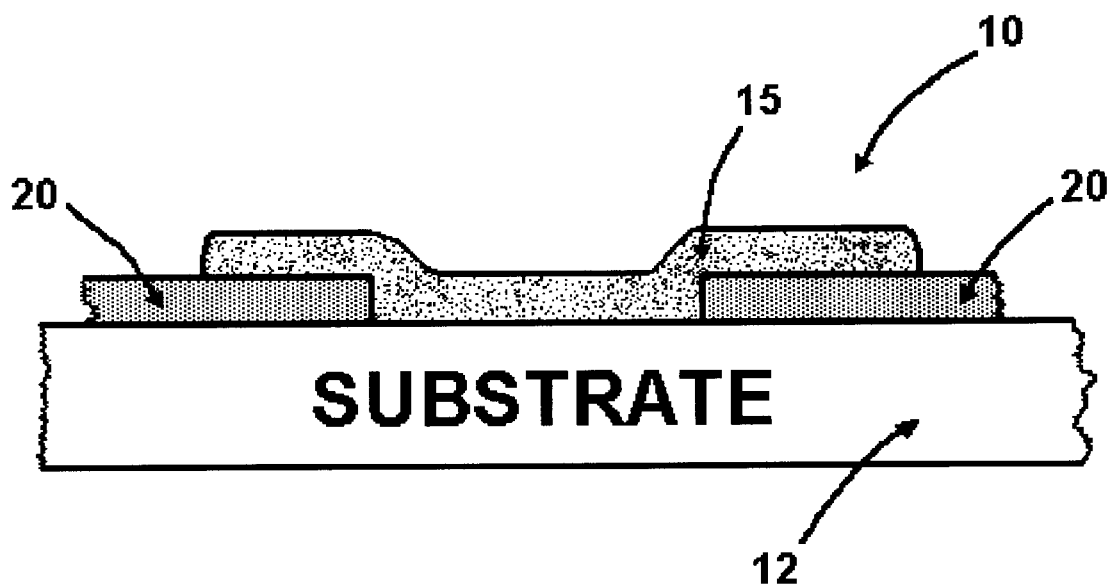
FIG. 1 is a schematic diagram showing a resettable fuse according to the present invention in contact with two fuse terminals of an electric circuit disposed on a substrate.

Resettable fuse compositions according to the present invention are comprised of a mixture of the reaction product of polyethylene glycol and a diepoxide, solvent, conductive particles, and optional solvent volatility adjusters. In the most preferred embodiment, the composition is screen printed directly onto a printed circuit disposed on a substrate having at least one fuse terminal formed of silver-filled epoxy resin to form a resettable fuse.

The reaction product for use in the invention preferably has a molecular weight of at least 18,000. In a preferred embodiment, the reaction product of polyethylene glycol and a diepoxide has an average molecular weight of at least about 20,000. A suitable reaction product having an average molecular weight of about 20,000, made by joining two molecules of polyethylene glycol having an average molecular weight of about 6,000 with a diepoxide, is commercially sold by Union Carbide Corporation under the trademark CARBOWAX20M. This material has a nominal melt temperature of about 60° C. and is somewhat more flexible than other solid polyethylene glycols. By increasing the average molecular weight of the reaction product, a range of melt temperatures can be obtained from about 60° C. to about 150° C.

The solvent used in the composition must be capable of dissolving the reaction product. Water is a preferred solvent, but other polar solvents may be used, especially for higher molecular weight reaction products. Because the composition is heat-cured to flash off the solvent, optional solvent volatility adjusters can be added to expedite or retard, as may be necessary, the rate evaporation of the solvent. Alcohols are the preferred solvent volatility adjusters for this application, with isopropyl alcohol being the most preferred solvent volatility adjuster. It will be readily apparent to those skilled in the art that a wide variety of other solvent volatility adjusters can be used, particularly ketones and aldehydes.

The conductive particles used in the composition can have a particle size of from about 0.01 to 200 microns, preferably from about 3.0 to 6.0 microns to facilitate screen printing. The particles can be of any shape, such as flakes, rods, spheroids, etc., preferably flakes. The particles can be comprised of silver, conductive carbon black, metal powders, alloy powders, conductive metal salts, and conductive metal oxides. Silver flake having a $D_{50}$ of about 4.5 microns is most preferred. By varying the degree of conductive particle loading, the ambient temperature resistance of the composition after curing can be varied from a few milliohms to many ohms.

The viscosity of the composition can be adjusted by varying the amount of solvent and optional volatility adjusters used. To facilitate screen printing, the solution should have a viscosity of from about 20,000 to about 70,000 cps at 25° C., with a viscosity of about 50,000 cps at that temperature being preferred. It should be understood that the viscosity of the composition can be adjusted to suit the particular application method being employed, and that a range of viscosities can be used without affecting the performance of the composition once cured.

In a preferred embodiment, the composition is comprised of from about 10% to about 30% by weight of the reaction product of polyethylene glycol and a diepoxide having an average molecular weight of at least about 18,000, from about 10% to about 30% by weight of solvent, from about 35% to about 65% by weight of conductive particles, and from about 0% to about 15% by weight of solvent volatility adjusters. More preferably for screen printing, the composition comprises from about 15% to about 25% by weight of the reaction product, from about 15% to about 25% by weight of solvent, from about 45% to about 55% by weight of conductive particles, and from about 5% to about 10% of solvent volatility adjusters. The proportion of the reaction product, solvent, and conductive particles is not per se critical, and can be varied to produce a composition which is suitable for a particular application.

The composition is prepared by dissolving the reaction of polyethylene glycol and a diepoxide in a solvent. Conductive particles are then slowly added under mixing until the desired concentration is reached. Suitable mixing can be achieved by any standard blender. Solvent volatility adjusters may be added if desired. Additional solvent and/or solvent volatility adjusters can be added to adjust the viscosity of the composition. It will be appreciated that the order of addition is not critical, and that the solution could be prepared according to many methods.

Resettable fuse compositions according to the present invention can be applied to printed circuit boards and other electronic devices in a wide variety of ways and in a wide variety of shapes in areas of limited space. In a preferred embodiment, the resettable fuse composition is applied to a printed circuit board by screen printing. The compositions can be applied to a wide variety of materials or substrates such as polyimide, FR4, alumina, glass or alumina nitride. By taking advantage of screen printing technology, which is well-known, unique fuse designs and configurations can be rendered quickly and easily.

After the material is applied across the fuse terminals of an electric circuit, a circuit board having the composition disposed thereon is subjected to heating for about 15 minutes to about 2 hours at from about 100° C. to about 175° C. to flash off the solvent and optional volatility adjusters and to cure the composition. The curing temperature will generally be higher than the boiling point of the solvent and the melt temperature of the reaction product. The curing time will depend upon the rate at which the solvent evaporates from the reaction product. Preferably, the rate of evaporation will be sufficient to accomplish curing in less than about 1 hour, but not so rapid as to cause pin holes to form in the cured reaction product. It is critical that the curing temperature and time be selected below that point when the reaction product begins to degrade or undergo additional polymerization, which is undesired. In a preferred embodiment using CARBOWAX20M as the solid crystalline wax, water as the solvent, silver flake as the conductive particles and isopropyl alcohol as the solvent volatility adjuster, curing can be accomplished in about 1 hour at 100° C.

The inventors believe resettable fuse compositions according to the present invention favorably interact with a known silver-filled epoxy resin fuse terminal material which is commercially available from Ferro Corporation under the product designation EA 013-3HT. Without limiting the scope of the instant invention in any way, the inventors hypothesize that the epoxy functional groups in the silver-filled epoxy resin interact with and chemically bond with the hydroxyl functional groups in the reaction product of the resettable fuse composition during heat curing. This chemical reaction is believed to allow the conductive particle chains or pathways in the resettable fuse composition to come into greater electrical contact with the conductive silver matrix of the silver-filed epoxy resin than would otherwise be possible using conventional plating techniques or if the resettable fuse composition was merely applied to a bare metal foil fuse terminals.

Resettable fuses formed from compositions according to the present invention differ from prior art PTC circuit protection devices in that switching is based upon the narrow melt temperature of the heat cured reaction product rather than upon the rather broad glass transition temperature (or phase) of a polymer. Upon reaching its melt temperature, the heat cured reaction product quickly changes from a solid state to a liquidus state. All electrical conduction through the material ceases in the liquidus state, meaning that absolutely no current continues to leak into the protected device. The inventors hypothesize that the degree of separation of conductive particles which occurs when the compositions according to the present invention pass into their liquidus state is approximately six times greater than the degree of separation of conductive particles which occurs when known PTC circuit protection devices are heated through their glass transition temperature regions. Once the fault condition has been cleared, resettable fuses according to the present invention quickly self-cool and re-solidify. Conduction returns quickly to its nominal state value at room temperature with no change in conduction caused by the heat history of the material.

Because the melting and cooling occurs rapidly, the compositions according to the present invention are capable of acting as thermostats. The cured material will oscillate between a conducting and non-conducting material based upon the melt temperature of the reaction product and the amount of current charged to the device. Resettable fuses according to the present invention do not switch based upon the glass transition temperature of the material, and are therefore not influenced by the change in crystallinity of the material caused by successive heat cycles. Thus, the switching temperature of resettable fuses according to the present invention will not change regardless of the heat history of the material.

Referring now to FIG. 2, there is shown a resettable fuse 10 made in accordance with the present invention formed on substrate 12. Fuse 10 includes a fuse section 15 formed of the reaction product of the polyethylene glycol and a diepoxide and the terminals 20 formed of silver-filled epoxy resin.

The following examples are intended only to illustrate the invention and should not be construed as imposing limitations upon the claims.

EXAMPLE

A resettable fuse composition according to the present invention was prepared by mixing 70 parts by weight of CARBOWAX20M available from Union Carbide Corporation with 26 parts by weight of water and 70 parts by weight of isopropyl alcohol. To this mixture was slowly added 166 parts by weight of silver flake having a $D_{50}$ of 4.5 microns available from Technic Corporation under part number XSF 499. After mixing, the composition exhibited a viscosity of about 50,000 cps. The composition was screen printed in a linear pattern so as to provide a connection between two fuse terminals formed from a silver-filled epoxy resin material available from Ferro Corporation under the product designation EA 013-3HT. The dimensions of the pattern are shown in FIG. 1. After heat curing for 1 hour at 100° C., a resettable fuse section was formed having a width of about 2.0 millimeters and a height of about 0.5 millimeters. The electrical resistance of the material as a function of temperature was measured as follows:

| Temperature (° C.) | Resistance (ohms) |
|---|---|
| 25 | 41.5 |
| 30 | 48 |
| 35 | 78 |
| 40 | 155 |
| 45 | 398 |
| 50 | 494 |
| 55 | 1,200 |
| 60 | 69,000 |
| 62 | 175,000 |
| 65 | ∞ |

Additional advantages and modifications will readily occur to those skilled in the art. Therefore, the invention in its broader aspects is not limited to the specific details and illustrative examples shown and described herein. Accordingly, various modifications may be made without departing from the spirit or scope of the general inventive concept as defined by the appended claims and their equivalents.

What is claimed is:

1. A resettable fuse comprising a fuse section and a first and a second fuse terminal disposed on a substrate, at least one of said fuse terminals being formed from a silver-filled epoxy resin material, said fuse section comprising a mixture of the reaction product of polyethylene glycol and a diepoxide having an average molecular weight of at least 18,000, solvent, conductive particles, and said solvent volatility adjusters, said mixture having been applied to said substrate so as to form a connection between said first and second fuse terminals and heated to flash off said solvent and said solvent volatility adjusters and cure said reaction product.

2. The resettable fuse of claim 1 wherein said reaction product prior to heat curing has an average molecular weight of at least 20,000.

3. The resettable fuse of claim 1 wherein said solvent is polar.

4. The resettable fuse of claim 3 wherein said solvent is water.

5. The resettable fuse of claim 1 wherein said conductive particles comprise one or more selected from the group consisting of silver, conductive carbon black, metal powders, alloy powders, conductive metal salts, and conductive metal oxides.

6. The resettable fuse of claim 5 wherein said conductive particles comprise silver flake having, a $D_{50}$ of 4.5 microns.

7. The resettable fuse of claim 1 wherein said conductive particles have a particle size of from about 0.01 to about 200 microns.

8. The resettable fuse of claim 7 wherein said conductive particles have a particle size of from about 3.0 to about 6.0 microns.

9. The resettable fuse of claim 1 wherein the shape of said conductive particles is one or more selected from the group consisting of flakes, rods, and spheroids.

10. The resettable fuse of claim 1 wherein said solvent volatility adjusters comprise one or more compounds selected from the group consisting of alcohols, ketones, and aldehydes.

11. The resettable fuse of claim 10 wherein said solvent volatility adjusters comprise isopropyl alcohol.

12. The resettable fuse of claim 1 wherein said mixture comprises by weight from about 10% to about 30% of said reaction product, from about 10% to about 30% of said solvent, from about 35% to about 65% of said conductive particles, and less than about 15% of said solvent volatility adjusters.

13. The resettable fuse of claim 1 wherein said mixture comprises by weight from about 15% to about 25% of said reaction product, from about 15% to about 25% of said solvent, from about 45% to about 55% of said conductive particles, and from about 5% to about 10% of said solvent volatility adjusters.

14. The resettable fuse of claim 1 wherein said mixture is applied to said substrate by screen printing.

15. The resettable fuse of claim 1 wherein said mixture prior to heat curing has a viscosity of from about 20,000 cps to about 70,000 cps at 25° C.

16. The resettable fuse of claim 15 wherein said mixture prior to heat curing has a viscosity of from about 50,000 cps at 25° C.

17. The resettable fuse of claim 1 wherein said substrate comprises a material selected from the group consisting of polyimide, FR4, alumina, glass and alumina nitride.

18. The resettable fuse of claim 1 wherein said mixture is heated for about 15 minutes to about 2 hours at from about 100° C. to about 175° C. to flash off said solvent and said volatility adjusters and cure said reaction product.

19. The resettable fuse of claim 1 wherein the melt temperature of said reaction product is within the range of from 60° C. to about 150° C.

20. The resettable fuse of claim 19 wherein upon reaching said melt temperature, said cured reaction product changes from an electrically conductive solid state to an electrically non-conductive liquidus state.

* * * * *

UNITED STATES PATENT AND TRADEMARK OFFICE
CERTIFICATE OF CORRECTION

PATENT NO : 5,963,121
DATED : Oct. 5, 1999
INVENTOR(S) : Stygar et al.

It is certified that error appears in the above-identified patent and that said Letters Patent is hereby corrected as shown below:

In claim 1, at column 7, line 31, delete the word "said" appearing before the words "solvent volatiliy adjusters".

Signed and Sealed this

Twenty-first Day of March, 2000

Attest:

Q. TODD DICKINSON

Attesting Officer

Commissioner of Patents and Trademarks